US012598808B2

(12) United States Patent
Ito et al.

(10) Patent No.: US 12,598,808 B2
(45) Date of Patent: Apr. 7, 2026

(54) DISPLAY DEVICE AND METHOD FOR MANUFACTURING DISPLAY DEVICE

(71) Applicant: KYOCERA Corporation, Kyoto (JP)

(72) Inventors: Hiroaki Ito, Ritto (JP); Nobuyuki Hasegawa, Sanda (JP); Fumiaki Haraguchi, Yasu (JP)

(73) Assignee: KYOCERA Corporation, Kyoto (JP)

( * ) Notice: Subject to any disclaimer, the term of this patent is extended or adjusted under 35 U.S.C. 154(b) by 368 days.

(21) Appl. No.: 18/267,676

(22) PCT Filed: Dec. 2, 2021

(86) PCT No.: PCT/JP2021/044311
§ 371 (c)(1),
(2) Date: Jun. 15, 2023

(87) PCT Pub. No.: WO2022/138051
PCT Pub. Date: Jun. 30, 2022

(65) Prior Publication Data
US 2024/0055442 A1 Feb. 15, 2024

(30) Foreign Application Priority Data

Dec. 21, 2020 (JP) ................................. 2020-211743

(51) Int. Cl.
*H10D 86/40* (2025.01)
*H01L 25/16* (2023.01)
(Continued)

(52) U.S. Cl.
CPC ......... *H10D 86/441* (2025.01); *H01L 25/167* (2013.01); *H10D 86/021* (2025.01); *H10D 86/60* (2025.01); *H10K 59/131* (2023.02)

(58) Field of Classification Search
USPC .......................................................... 257/91
See application file for complete search history.

(56) References Cited

U.S. PATENT DOCUMENTS

2015/0277485 A1 10/2015 Kosugi et al.
2016/0363800 A1* 12/2016 Kim ..................... H10D 86/411
(Continued)

FOREIGN PATENT DOCUMENTS

JP H8-340058 A 12/1996
JP 2013232474 A * 11/2013
(Continued)

OTHER PUBLICATIONS

Machine-generated English translation of JP 2013232474 (Year: 2013).*

*Primary Examiner* — Bo B Jang
(74) *Attorney, Agent, or Firm* — Procopio, Cory, Hargreaves & Savitch LLP

(57) ABSTRACT

A display device includes a substrate including a first surface, a side surface, and a second surface opposite to the first surface, a pixel unit located on the first surface and including a light emitter, a first connection pad adjacent to an edge on the first surface and electrically connected to the pixel unit, a second connection pad adjacent to the edge on the second surface, and a side wire extending from the first surface through the side surface to the second surface and connecting the first connection pad and the second connection pad. The first connection pad and the second connection pad have different sizes.

15 Claims, 11 Drawing Sheets

(51) Int. Cl.
    *H10D 86/01*     (2025.01)
    *H10D 86/60*     (2025.01)
    *H10K 59/131*     (2023.01)

(56)           References Cited

U.S. PATENT DOCUMENTS

| | | |
|---|---|---|
| 2017/0185187 A1 | 6/2017 | Nakayama et al. |
| 2018/0166615 A1 | 6/2018 | Takagishi |
| 2020/0013803 A1 | 1/2020 | Jang et al. |

FOREIGN PATENT DOCUMENTS

| | | |
|---|---|---|
| JP | 2015-194993 A | 11/2015 |
| JP | 2017-9725 A | 1/2017 |
| WO | 2016/038940 A1 | 3/2016 |

* cited by examiner

DISPLAY DEVICE AND METHOD FOR MANUFACTURING DISPLAY DEVICE

TECHNICAL FIELD

The present disclosure relates to a display device such as a self-luminous display device including light emitters such as light-emitting diodes (LEDs), and a method for manufacturing the display device.

BACKGROUND OF INVENTION

Known display devices are described in, for example, Patent Literatures 1 and 2.

CITATION LIST

Patent Literature

Patent Literature 1: Japanese Unexamined Patent Application Publication No. 2017-009725
Patent Literature 2: Japanese Unexamined Patent Application Publication No. 2015-194993

SUMMARY

In an aspect of the present disclosure, a display device includes a substrate including a first surface, a side surface, and a second surface opposite to the first surface, a pixel unit located on the first surface and including a light emitter, a first connection pad adjacent to an edge on the first surface and electrically connected to the pixel unit, a second connection pad adjacent to the edge on the second surface, and a side wire extending from the first surface through the side surface to the second surface and connecting the first connection pad and the second connection pad. The first connection pad and the second connection pad have different sizes.

In another aspect of the present disclosure, a method for manufacturing a display device includes preparing a mother substrate including a first surface, a second surface opposite to the first surface, and a plurality of display device areas on the first surface, forming a plurality of pixel areas on each of the plurality of display device areas, forming a first connection pad on a portion adjacent to an edge on each of the plurality of display device areas, forming a second connection pad having a size different from a size of the first connection pad on a portion adjacent to the edge on the second surface, cutting the mother substrate along the edge of each of the plurality of display device areas to form display device substrates, and forming, on each of the display device substrates, a side wire extending from the first surface through a cut surface being a side surface to the second surface to connect the first connection pad and the second connection pad.

BRIEF DESCRIPTION OF THE DRAWINGS

The objects, features, and advantages of the present disclosure will become more apparent from the following detailed description and the drawings.

DESCRIPTION OF EMBODIMENTS

The structure that forms the basis of a display device according to one or more embodiments of the present disclosure will now be described. Patent Literature 1 describes a display device that includes pixel units each including self-luminous light emitters such as light-emitting diodes (LEDs) or organic electroluminescent elements. Patent Literature 2 describes a composite large display device (hereafter also referred to as a multi-display) including multiple tiled display devices.

Known display devices include, as wiring to drive a display, for example, wiring on the front surface of a substrate on which the display is located and wiring on the back surface of the substrate on which components such as a drive are located. Such display devices include a feedthrough conductor extending through the substrate from the front surface to the back surface and a connection conductor such as side wiring to connect a front connection pad connected to the wiring on the front surface and a back connection pad connected to the wiring on the back surface. The front and back connection pads in such display devices formed by, for example, photolithography may deviate from their intended positions by about several to several tens of micrometers due to, for example, misalignment of photo-masks or the resolution limit based on the wavelength of a light source for exposure. Similarly, the connection conduc-tor such as side wiring may also have positional deviations. Such positional deviations may increase difficulty in con-necting the front connection pad and the back connection pad using the connection conductor. The connection between the front connection pad and the back connection pad may also deteriorate, increasing the resistance of the connection conductor. This may cause a lower manufactur-ing yield of display devices or uneven luminance or uneven colors in display images, and thus a lower image quality of display devices.

A display device according to one or more embodiments of the present disclosure will now be described with refer-ence to the drawings. Each figure referred to below illus-trates main components and other elements of the display device according to one or more embodiments of the present disclosure. The display device according to the embodi-ments of the present disclosure may thus include known components that are not illustrated, for example, circuit boards, wiring conductors, control ICs, and LSI circuits. Each figure referred to below is also schematic and is not drawn to scale relative to, for example, the actual positions and dimensional ratios of components of the display device.

Figure 1:
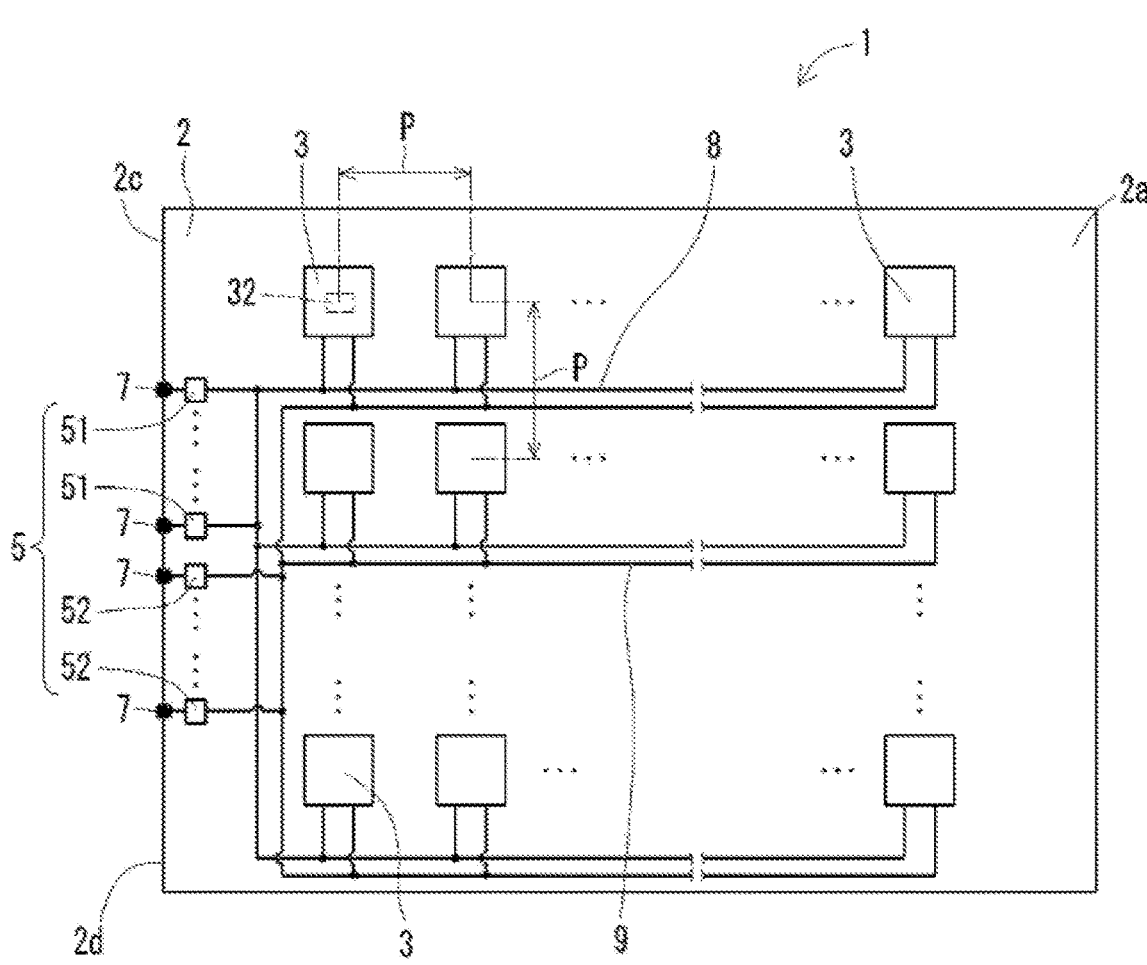
FIG. 1 is a schematic circuit diagram of a display device according to an embodiment of the present disclosure on a first surface of a substrate.
Figure 2:
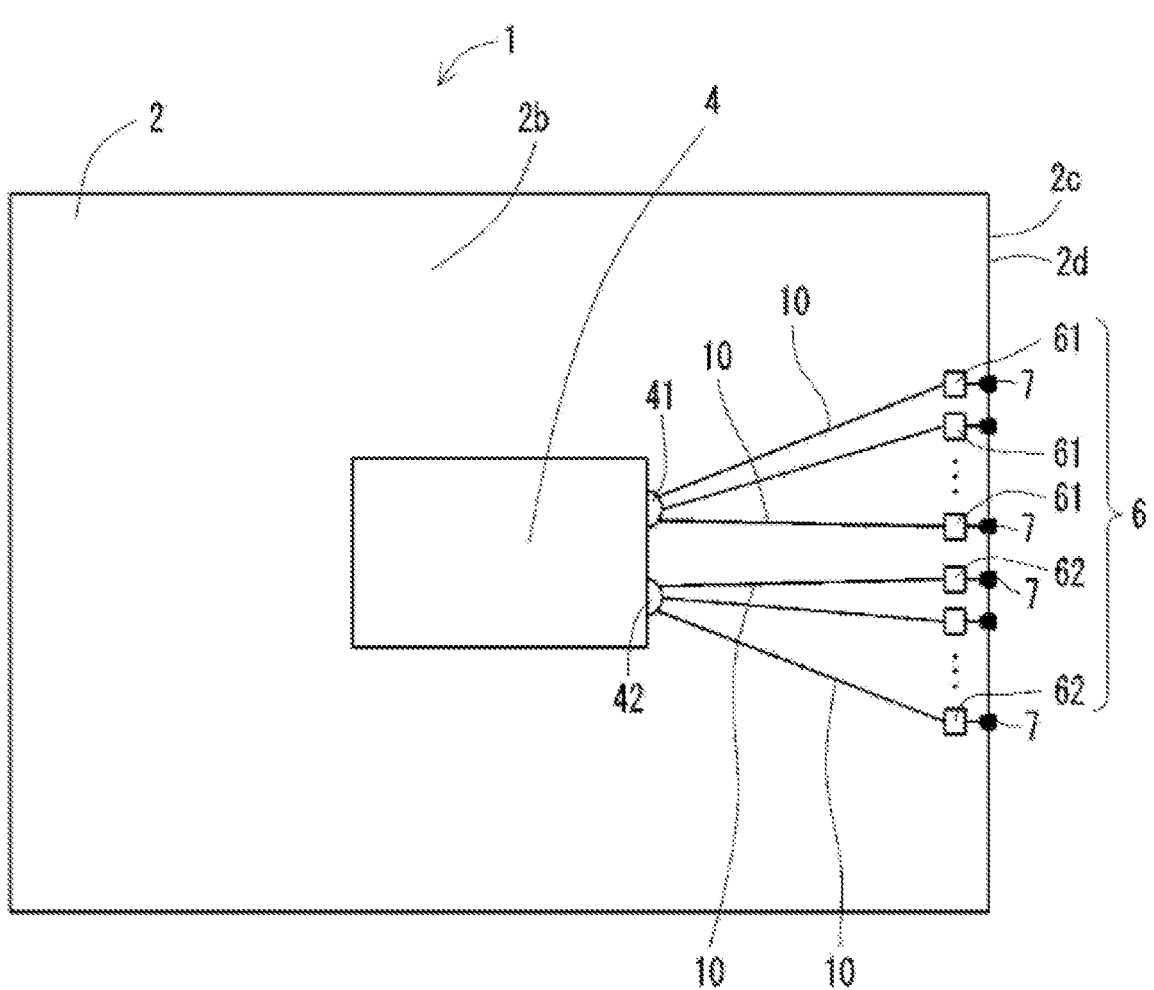
FIG. 2 is a schematic circuit diagram of the display device according to the embodiment of the present disclosure on a second surface of the substrate.
Figure 3A:
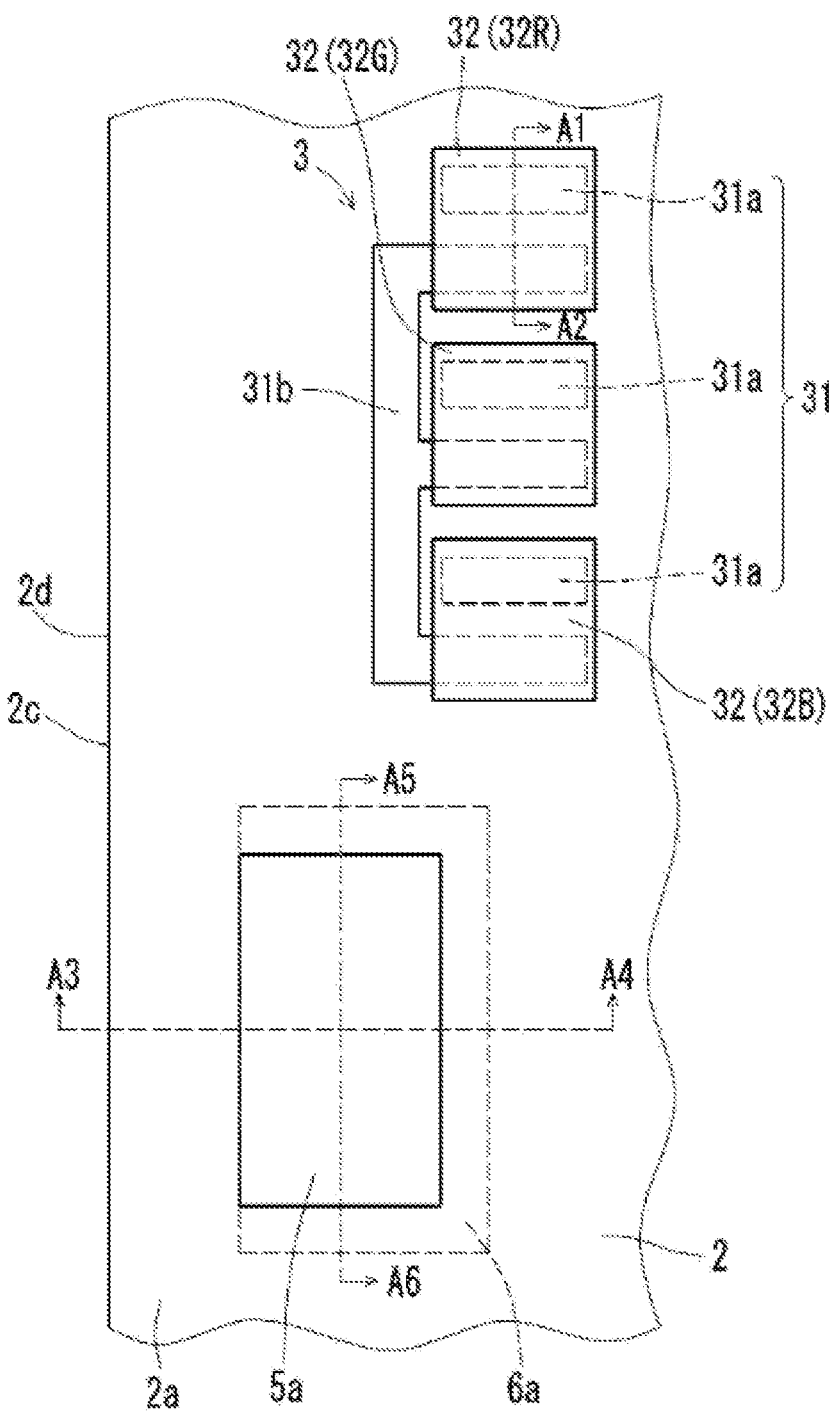
FIG. 3A is a partial plan view of the display device according to the embodiment of the present disclosure, illustrating its main part in an enlarged manner.
Figure 3B:
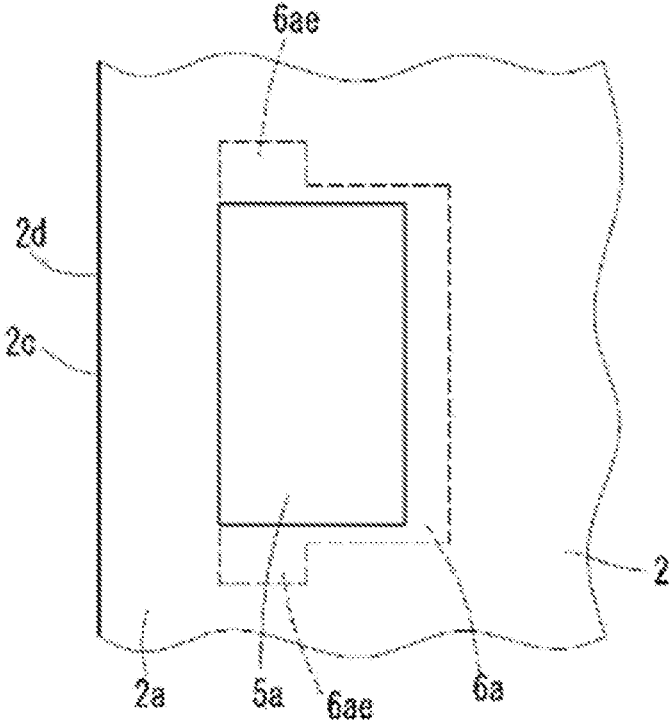
FIG. 3B is a partial plan view of a display device according to a variation of the embodiment of the present disclosure, illustrating its main part in an enlarged manner.
Figure 4:
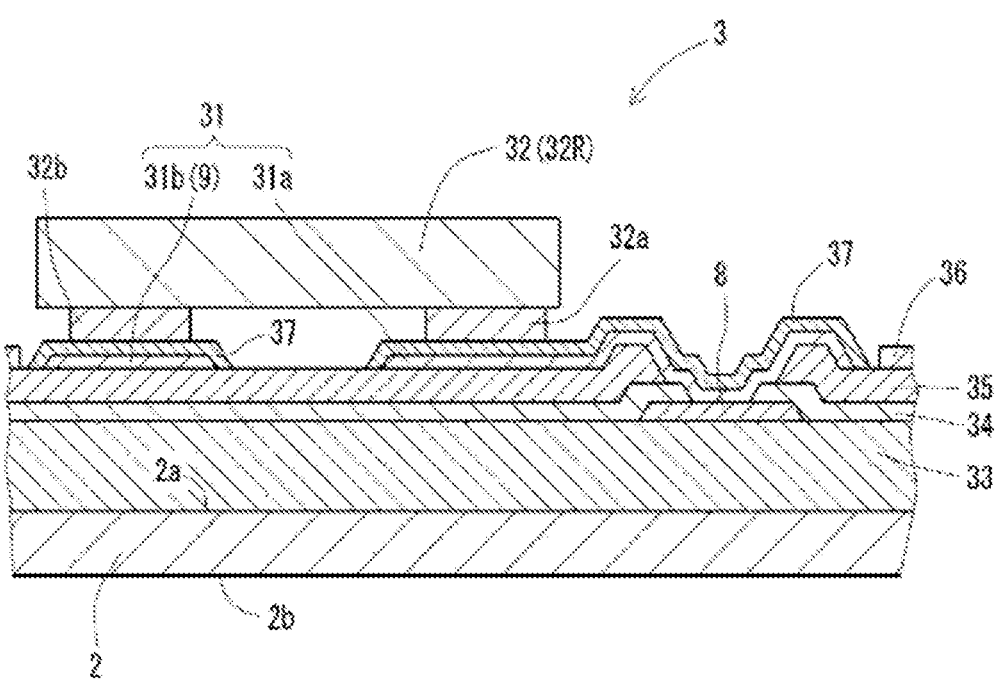
FIG. 4 is a cross-sectional view taken along line A1-A2 in FIG. 3A.
Figure 5:
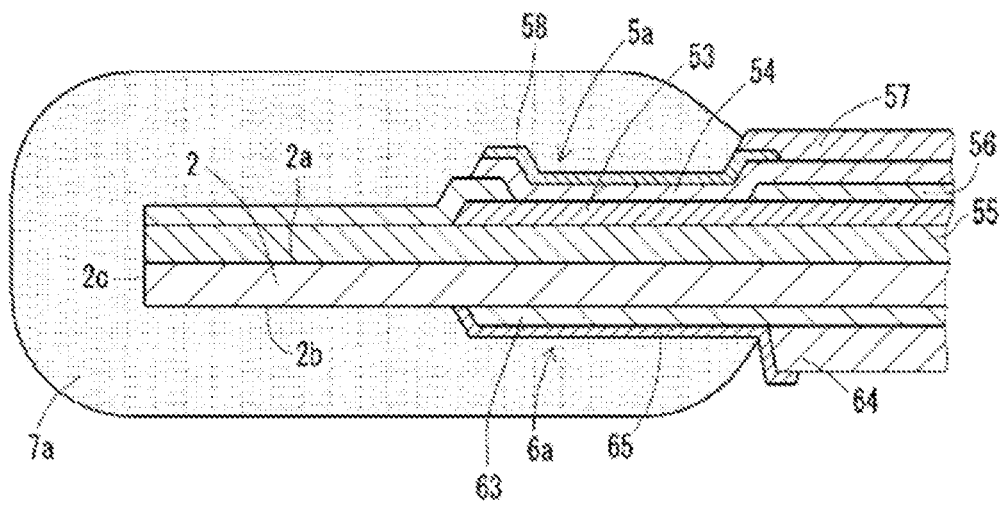
FIG. 5 is a cross-sectional view taken along line A3-A4 in FIG. 3A.
Figure 6A:
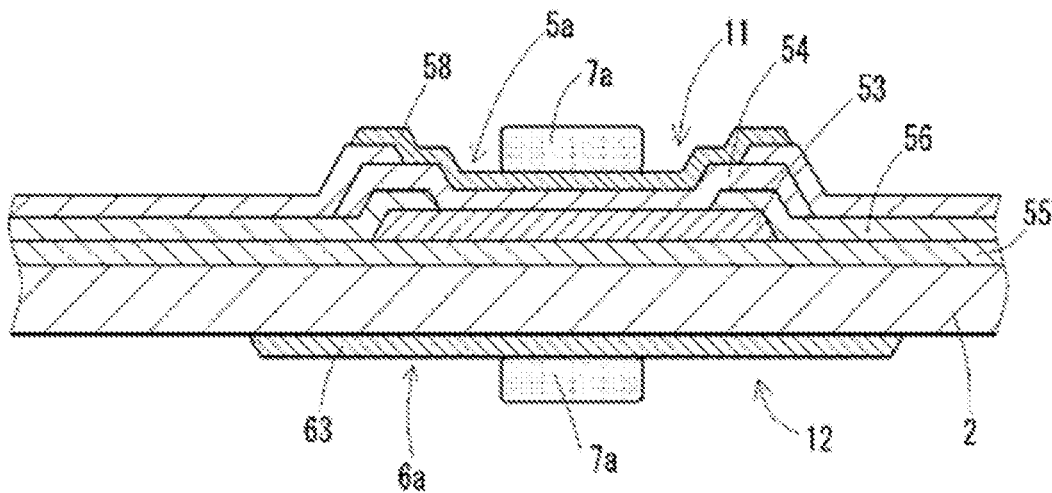
FIG. 6A is a cross-sectional view taken along line A5-A6 in FIG. 3A.
Figure 6B:
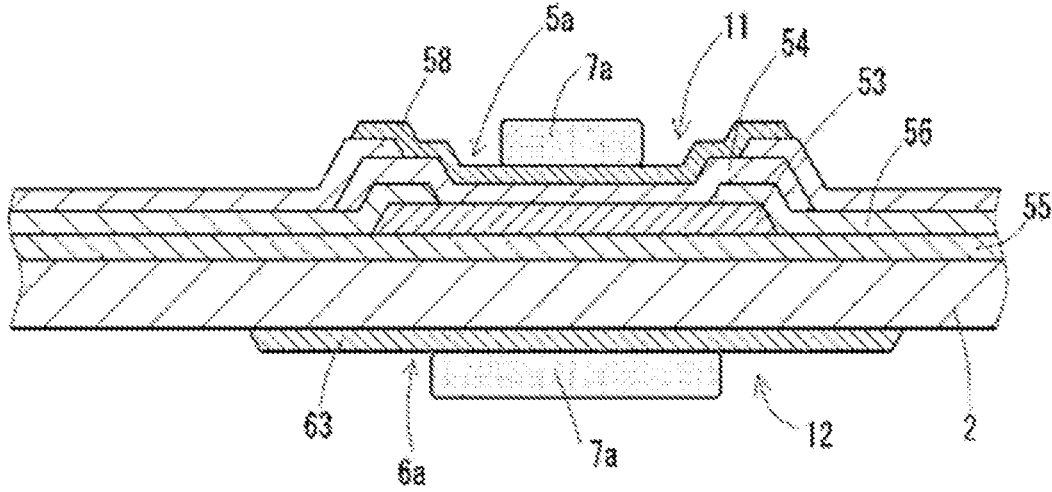
FIG. 6B is a cross-sectional view of a display device according to another embodiment of the present disclosure, corresponding to the cross-sectional view taken along line A5-A6 in FIG. 3A.
Figure 7:
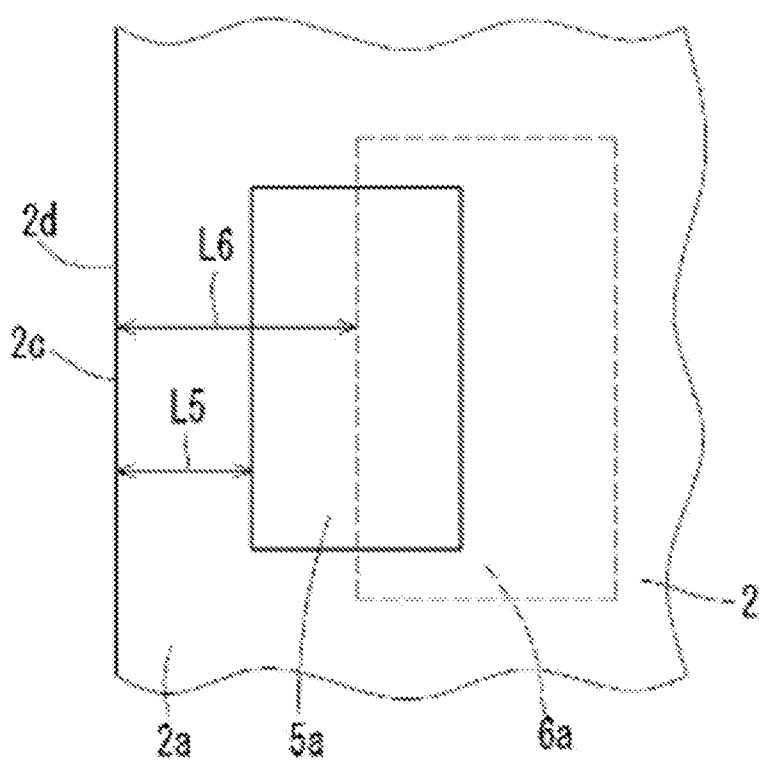
FIG. 7 is a partial plan view of a display device according to a variation of the embodiment of the present disclosure, illustrating its main part in an enlarged manner.
Figure 8A:
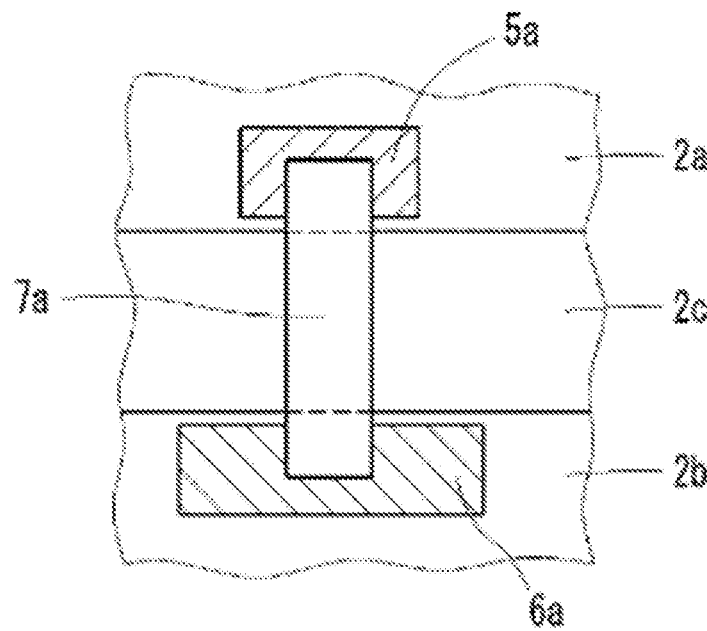
FIG. 8A is a development view of the display device according to the embodiment of the present disclosure, illustrating a side wire.
Figure 8B:
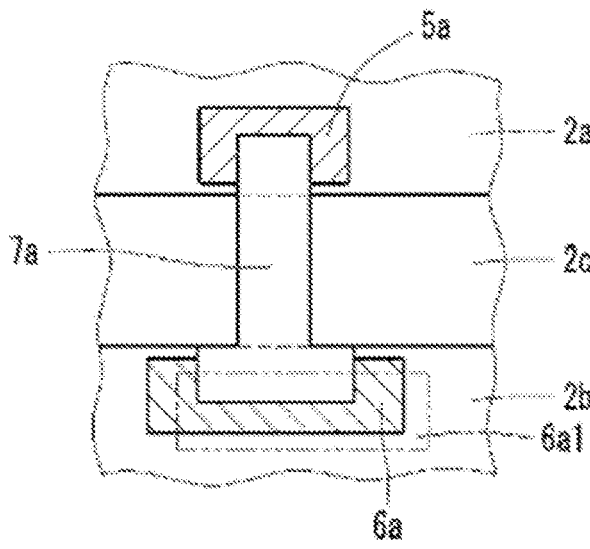
FIG. 8B is a development view of a display device according to another embodiment of the present disclosure, illustrating a side wire.
Figure 9:
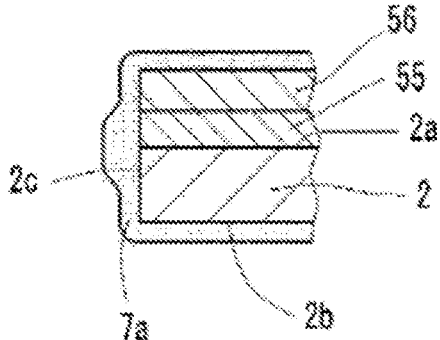
FIG. 9 is a cross-sectional view of a display device according to another embodiment of the present disclosure, illustrating a side wire.

FIG. 1 is a schematic circuit diagram of a display device according to an embodiment of the present disclosure, illustrating circuit wiring and other components on a first surface of the display device. FIG. 2 is a schematic circuit diagram of the display device according to the embodiment of the present disclosure, illustrating circuit wiring and other components on a second surface of the display device. FIG. 3A is a partial plan view of the display device according to the embodiment of the present disclosure, illustrating its main part in an enlarged manner. FIG. 4 is a cross-sectional view taken along line A1-A2 in FIG. 3A. FIG. 5 is a cross-sectional view taken along line A3-A4 in FIG. 3A. FIG. 6A is a cross-sectional view taken along line A5-A6 in FIG. 3A. FIG. 6B is a cross-sectional view of a display device according to another embodiment, corresponding to the cross-sectional view taken along line A5-A6 in FIG. 3A. FIG. 7 is a partial plan view of a display device according to a variation of the embodiment of the present disclosure, illustrating its main part in an enlarged manner. FIGS. 8A and 8B are development views of display devices according to two embodiments of the present disclosure, illustrating a side wire. FIG. 9 is a cross-sectional view of a display device according to an embodiment of the present disclosure, illustrating a side wire. For simplicity, FIG. 3A illustrates a pixel unit including light emitters and an electrode pad without illustrating other elements. FIGS. 3A to 3C and 7 each illustrate the display device without illustrating the side wire. FIGS. 6A and 6B each illustrate the display device without illustrating a part of the side wire (a part located on a side surface 2c of a substrate 2). FIGS. 8A, 8B, and 10 to 14 illustrate first to third surfaces on the same plane to clearly illustrate the side wire extending from the first surface through the third surface (side surface) to the second surface.

A display device 1 includes a substrate 2, a pixel unit 3, a first connection pad 5, a second connection pad 6, and a side wire 7.

The display device 1 includes the substrate 2 including a first surface 2a, a side surface 2c, and a second surface 2b opposite to the first surface 2a, the pixel unit 3 located on the first surface 2a and including a light emitter 32, the first connection pad 5 located adjacent to an edge 2d on the first surface 2a and electrically connected to the pixel unit 3, the second connection pad 6 located adjacent to the edge 2d on the second surface 2b, and the side wire 7 extending from the first surface 2a through the side surface 2c to the second surface 2b and connecting the first connection pad 5 and the second connection pad 6. The first connection pad 5 and the second connection pad 6 have different sizes. The size of the first connection pad 5 may also refer to the dimensions or the area of the first connection pad 5. The same applies to the size of the second connection pad 6.

The first connection pad 5 is electrically connected to the pixel unit 3. For example, the first connection pad 5 may be connected to the pixel unit 3 with a thin-film transistor (TFT). More specifically, the first connection pad 5 may be connected to the pixel unit 3 with an electrical intervening component such as a TFT, an electrode, or wiring.

The display device 1 with the above structure produces the effects described below. When the first connection pad 5 and the second connection pad 6 having different sizes deviate from their intended positions due to lower printing accuracy or other causes, either the first connection pad 5 or the second connection pad 6 having a larger size can compensate for (accommodate) the positional deviation. This allows the first connection pad 5 and the second connection pad 6 to be appropriately connected to each other with the side wire 7, thus improving the manufacturing yield of the display device 1 and the image quality. When the side wire 7 deviates from its intended position due to lower printing accuracy or other causes, the above effects also allow the first connection pad 5 and the second connection pad 6 to be appropriately connected to each other with the side wire 7.

For the size ratio between the first connection pad 5 and the second connection pad 6, or specifically the area ratio, the area of the larger pad may be, but not limited to, more than one time and not more than about five times the area of the smaller pad. However, with the value exceeding five times, the substrate 2 may be too large.

The substrate 2 is, for example, a transparent or opaque glass substrate, a plastic substrate, or a ceramic substrate. The substrate 2 includes the first surface 2a, the second surface 2b opposite to the first surface 2a, and a third surface 2c connecting the first surface 2a and the second surface 2b. The first surface 2a is also referred to as a display surface, and the second surface 2b is also referred to as a non-display surface. The third surface 2c is also referred to as a side surface or one side surface. The substrate 2 may be a triangular plate, a rectangular plate, a hexagonal plate, a trapezoidal plate, a circular plate, an elliptic plate, or a plate with any other shape. The substrate 2 being, for example, an equilateral triangular plate, a rectangular plate, or an equi-lateral hexagonal plate facilitates tiling of multiple display devices 1 into a multi-display. In the present embodiment, the substrate 2 is a rectangular plate, as illustrated in, for example, FIG. 1.

The display device 1 may include multiple pixel units 3 located on the first surface 2a. The pixel units 3 serve as a display area in the display device 1. As illustrated in, for example, FIG. 1, the pixel units 3 are arranged in a matrix with a predetermined pixel pitch P. The pixel pitch P may be, for example, about 40 to 400 μm, about 40 to 120 μm, about 60 to 100 μm, or about 80 μm. A range of values referred to herein as one value to another value intends to mean the two values being inclusive.

Each pixel unit 3 includes an electrode pad 31 (as illustrated in FIGS. 3A and 4) and the light emitter 32 electrically connected to the electrode pad 31.

The light emitter 32 is, for example, a self-luminous light emitter such as an LED, an organic electroluminescent element, or a semiconductor laser element. In the present embodiment, the light emitter 32 is an LED. The light emitter 32 may be a micro-LED. In this case, the light emitter 32 connected to the electrode pad 31 may be rectangular as viewed in a plan view with each side having a length of about 1 to 100 μm inclusive, or about 3 to 10 μm inclusive.

The light emitter 32 is electrically connected to the electrode pad 31 with a conductive bond, such as a conductive adhesive, solder, or an anisotropic conductive film (ACF). The electrode pad 31 in the present embodiment includes an anode pad 31a and a cathode pad 31b. The anode pad 31a is electrically connected to an anode terminal 32a of the light emitter 32. The cathode pad 31b is electrically connected to a cathode terminal 32b of the light emitter 32.

Each pixel unit 3 may include multiple anode pads 31a, a single cathode pad 31b or multiple cathode pads 31b, and multiple light emitters 32. The multiple anode pads 31a are electrically connected with the multiple anode terminals 32a of the multiple light emitters 32. The single cathode pad 31b or the multiple cathode pads 31b are electrically connected with the multiple cathode terminals 32b of the multiple light emitters 32. When the pixel unit 3 includes a single cathode pad 31b, the cathode pad 31b can be common to the multiple light emitters 32. The light emitters 32 may include a light emitter 32R that emits red light, a light emitter 32G that emits green light, and a light emitter 32B that emits blue light. In this case, each pixel unit 3 enables display of color tones. Each pixel unit 3 may include, instead of the light emitter 32R that emits red light, a light emitter that emits orange, red-orange, red-violet, or violet light. Each pixel unit 3 may include, instead of the light emitter 32G that emits green light, a light emitter that emits yellow-green light.

As illustrated in FIG. 2, the structure may include a drive such as a power supply circuit 4 on the second surface 2b. The power supply circuit 4 generates power supply voltages to be provided to the pixel units 3. The power supply voltages include a first power supply voltage VDD and a second power supply voltage VSS. The power supply circuit 4 includes a VDD terminal 41 for outputting the first power supply voltage VDD and a VSS terminal 42 for outputting the second power supply voltage VSS. The first power supply voltage VDD is an anode voltage of, for example, about 3 to 15 V or about 10 to 15 V. The second power supply voltage VSS is lower than the first power supply voltage VDD and is a cathode voltage of, for example, about −3 to 3V or about 0 to 3 V.

The power supply circuit 4 may include a control element such as a control circuit or an IC for controlling, for example, the emission or non-emission state and the light intensity of the light emitters 32. The power supply circuit 4 may be, for example, a thin film circuit on the second surface 2b. In this case, the thin film circuit may include, for example, a semiconductor layer including low-temperature polycrystalline silicon (LTPS) formed directly on the second surface 2b by a thin film formation method such as chemical vapor deposition (CVD).

The display device 1 may include multiple first connection pads 5 located adjacent to the edge 2d of the substrate 2 on the first surface 2a. The first connection pads 5 may be at positions that are about 10 to 500 μm away from the edge 2d of the substrate 2 on the first surface 2a toward the center of the first surface 2a. Each first connection pad 5 may be at a distance of about half the pixel pitch P from the edge 2d of the substrate 2. In this case, multiple display devices 1 can be joined to be a multi-display with a pixel pitch between the display devices 1 equal to the pixel pitch for the display in each display device. This allows the multi-display to have a uniform pixel pitch and an improved image quality. For a multi-display being formed with light absorbers placed between adjacent display devices 1, for example, each first connection pad 5 may at a distance shorter than half the pixel pitch P from the edge 2d of the substrate 2.

In the present embodiment, as illustrated in FIG. 1, the first connection pads 5 may include multiple first power supply connection pads 51 and multiple second power supply connection pads 52. The first power supply connection pads 51 are used to apply the first power supply voltage VDD to the pixel units 3. The second power supply connection pads 52 are used to apply the second power supply voltage VS S to the pixel units 3.

The display device 1 includes a first wiring pattern 8 and a second wiring pattern 9. The first wiring pattern 8 and the second wiring pattern 9 are located on the first surface 2a. The first wiring pattern 8 and the second wiring pattern 9 include layers of, for example, Mo/Al/Mo or MoNd/AlNd/MoNd. The stack of Mo/Al/Mo includes a Mo layer, an Al layer, and a Mo layer in this order. The same applies to other notations. MoNd is an alloy of Mo and Nd. As illustrated in, for example, FIG. 1, the first wiring pattern 8 electrically connects the pixel units 3 and the first power supply connection pads 51, and the second wiring pattern 9 electrically connects the pixel units 3 and the second power supply connection pads 52. The first wiring pattern 8 and the second wiring pattern 9 may be planar and electrically insulated from each other with insulating layers (insulating layers 34 and 35 described later) between them. The second wiring pattern 9 may include the cathode pads 31b of the electrode pads 31 as parts of the second wiring pattern 9.

The display device 1 may include multiple second connection pads 6 located adjacent to the edge 2d on the second surface 2b at positions substantially corresponding to the first connection pads 5 as viewed in a plan view. As illustrated in FIG. 2, the second connection pads 6 may include multiple third power supply connection pads 61 and multiple fourth power supply connection pads 62. The third power supply connection pads 61 are used to apply the first power supply voltage VDD to the pixel units 3. The fourth power supply connection pads 62 are used to apply the second power supply voltage VSS to the pixel units 3.

The display device 1 may include as many first power supply connection pads 51 as the third power supply connection pads 61, and as many second power supply connection pads 52 as the fourth power supply connection pads 62. Each first power supply connection pad 51 may at least partially overlap one or more of the third power supply connection pads 61 as viewed in a plan view. Each second power supply connection pad 52 may at least partially overlap one or more of the fourth power supply connection pads 62 as viewed in a plan view.

The first connection pads 5 may include connection pads connected to, for example, a scanning signal line (gate signal line), an image signal line (source signal line), or an emission control signal line. The same applies to the second connection pads 6.

As illustrated in FIG. 2, the display device 1 may include a third wiring pattern 10. The third wiring pattern 10 is located on the second surface 2*b*. The third wiring pattern 10 includes layers of, for example, Mo/A1/Mo or MoNd/AlNd/MoNd. The third wiring pattern 10 may be thick film wiring including a conductive paste containing conductive particles of, for example, silver applied by, for example, printing, and fired. The third wiring pattern 10, for example, connects the VDD terminal 41 in the power supply circuit 4 and the third power supply connection pads 61, and connects the VS S terminal 42 in the power supply circuit 4 and the fourth power supply connection pads 62.

The display device 1 includes the side wire 7 extending from the first surface 2*a* through the side surface 2*c* connecting the first surface 2*a* and the second surface 2*b* to the second surface 2*b*. The display device 1 may include multiple side wires 7. The side wires 7 connect the first connection pads 5 and the second connection pads 6. In the present embodiment, the side wires 7 electrically connect the first power supply connection pads 51 and the third power supply connection pads 61, and electrically connect the second power supply connection pads 52 and the fourth power supply connection pads 62. Some of the first connection pads 5 and some of the second connection pads 6 may be connected to each other with feedthrough conductors located at the periphery of the substrate 2 and extending through the substrate 2 from the first surface 2*a* to the second surface 2*b*. The first connection pads 5 and the second connection pads 6 are connected with the side wires 7 to easily reduce the area of the display device 1 outside the display area (specifically, a frame portion).

The pixel units 3, the first connection pads 5, the second connection pads 6, and the side wires 7 will now be described in detail with reference to FIGS. 3A to 6B. FIGS. 3A and 5 to 6B illustrate, among the multiple first connection pads 5, the multiple second connection pads 6, and the multiple side wires 7, a first connection pad 5*a*, a second connection pad 6*a*, and a side wire 7*a* in the display device 1 according to one embodiment.

As illustrated in, for example, FIG. 3A, each pixel unit 3 in the present embodiment includes the electrode pad 31 including three anode pads 31*a* and one common cathode pad 31*b*. Each pixel unit 3 includes the light emitter 32R that emits red light, the light emitter 32G that emits green light, and the light emitter 32B that emits blue light. The light emitters 32R, 32G, and 32B may be arranged in line as viewed in a plan view as illustrated in, for example, FIG. 3A. The light emitters 32R, 32G, and 32B may be arranged in an L shape as viewed in a plan view. This allows each pixel unit 3 to be smaller as viewed in a plan view, and to be compact and square as viewed in a plan view. The display device 1 thus includes pixels with higher density, allowing high-quality image display.

As illustrated in, for example, FIG. 4, each pixel unit 3 includes insulating layers 33 to 36 located on the first surface 2*a* of the substrate 2. The insulating layers 33 to 36 are inorganic insulating layers of, for example, $SiO_2$ or $Si_3N_4$ or organic insulating layers of, for example, an acrylic resin or polycarbonate. Although not illustrated, a pixel circuit including a TFT or another element for controlling the light emission of the light emitter 32 is located inside the insulating layer 33 nearest the substrate 2 of the insulating layers

33 to 36 or between the insulating layer 33 and the substrate 2. The insulating layers 34 and 35 are located between the first wiring pattern 8 and the second wiring pattern 9 and electrically insulating them from each other.

The light emitter 32 includes the anode terminal 32*a* electrically connected to the anode pad 31*a*, and the cathode terminal 32*b* electrically connected to the cathode pad 31*b* that is connected to the second wiring pattern 9. The anode pad 31*a* and the cathode pad 31*b* are electrically insulated from each other by an opening (cutout) around the anode pad 31*a* in the second wiring pattern 9. The cathode pad 31*b* is electrically connected to the second wiring pattern 9 with wiring routed along the surfaces of the insulating layer 35 and the inner wall of the opening in the insulating layer 36. The anode pad 31*a* and the cathode pad 31*b* may have their surfaces coated with a transparent conductive layer 37 of, for example, indium tin oxide (ITO) or indium zinc oxide (IZO).

The first connection pad 5*a* and the second connection pad 6*a* are made of a conductive material. The first connection pad 5*a* and the second connection pad 6*a* may each include a single metal layer, or multiple metal layers stacked on one another. The first connection pad 5*a* and the second connection pad 6*a* include metal layers of, for example, Al, Al/Ti, Ti/Al/Ti, Mo, Mo/Al/Mo, MoNd/AlNd/MoNd, Cu, Cr, Ni, or Ag. In the example of FIGS. 5 to 6B, the first connection pad 5*a* includes two metal layers 53 and 54 stacked on each other and located on an insulating layer 55 on the first surface 2*a* of the substrate 2. In the example of FIGS. 5 to 6B, the second connection pad 6*a* includes a single metal layer 63 located on the second surface 2*b* of the substrate 2. FIG. 5 illustrates a protective insulating layer (overcoat) 64.

As illustrated in, for example, FIGS. 5 to 6B, the first connection pad 5*a* including the metal layers 53 and 54 stacked on each other may include an insulating layer 56 between the edges of the metal layers 53 and 54. The first connection pad 5*a* may include an insulating layer 57 at its inward (right in FIG. 5) end on the first surface 2*a*. This reduces the likelihood of short-circuiting between the first connection pad 5*a* and a wiring conductor or another element located inward on the first surface 2*a*. The insulating layers 55, 56, and 57 are made of, for example, $SiO_2$, $Si_3N_4$, or a polymeric material such as an acrylic resin. The first connection pad 5*a* may have its surface coated with a transparent conductive layer 58 of, for example, ITO or IZO. The second connection pad 6*a* may have its surface coated with a transparent conductive layer 65 of, for example, ITO or IZO. The first connection pads 5 other than the first connection pad 5*a* may have the same or similar structure as the first connection pad 5*a*. The second connection pads 6 other than the second connection pad 6*a* may have the same or similar structure as the second connection pad 6*a*.

As illustrated in, for example, FIGS. 5 to 6B, the side wire 7*a* extends from the side surface 2*c* to the first surface 2*a* and to the second surface 2*b*, and connects the first connection pad 5*a* and the second connection pad 6*a*. The side wire 7*a* may include a conductive paste containing conductive particles of, for example, Ag, Cu, Al, or stainless steel, an uncured resin component, an alcohol solvent, and water. The conductive paste may be applied to an intended portion from the side surface 2*c* to the first surface 2*a* and to the second surface 2*b* and cured by heating, photocuring using ultraviolet ray irradiation, or a combination of photocuring and heating. The side wire 7*a* may also be formed with a thin film formation method such as plating, vapor deposition, or CVD. The side surface 2*c* may include a groove formed in advance to receive the side wire 7*a*. This allows the conductive paste for the side wire 7*a* to be easily received in the intended portion on the side surface. The side wires 7 other than the side wire 7a may be formed with the same or similar method to the side wire 7a.

Although not illustrated, the display device 1 includes multiple gate signal lines and multiple source signal lines intersecting with the gate signal lines on the first surface 2a. Each pixel unit 3 includes multiple first electrode pads connected to the gate signal lines, multiple second electrode pads connected to the source signal lines, and a TFT for driving the light emitter connected to the first electrode pads and the second electrode pads. Although not illustrated, the display device 1 includes, on the second surface 2b, multiple third electrode pads electrically connected to the first electrode pads, and multiple fourth electrode pads electrically connected to the second electrode pads. The first electrode pads and the third electrode pads may be connected to each other with, for example, side wires having the same or similar structure to the side wires 7 or 7a. The second electrode pads and the fourth electrode pads may be connected to each other with, for example, side wires having the same or similar structure to the side wires 7 or 7a. The third electrode pads may be connected to a gate signal line drive (gate driver) located on the second surface 2b with, for example, back wiring. The fourth electrode pads may be connected to a source signal line drive (source driver) located on the second surface 2b with, for example, back wiring. The gate signal line drive and the source signal line drive may be included in the power supply circuit.

As illustrated in, for example, FIG. 3A, the display device 1 includes the first connection pad 5a and the second connection pad 6a having different sizes as viewed in a plan view. When the first connection pad 5a and the second connection pad 6a deviate from their intended positions, either the first connection pad 5a or the second connection pad 6a having a larger size can compensate for the positional deviation. More specifically, as viewed in a plan view, either the first connection pad 5a or the second connection pad 6a having a larger size overlaps most of the smaller pad or includes the smaller pad. This allows the first connection pad 5a and the second connection pad 6a to be appropriately connected to each other with the side wire 7a. When the side wire 7a deviates from its intended position due to lower printing accuracy or other causes, the above effects also allow the first connection pad 5a and the second connection pad 6a to be appropriately connected to each other with the side wire 7a.

Upon forming the side wire 7a that connects the first connection pad 5a and the second connection pad 6a, a pattern for applying the conductive paste for the side wire 7a is set based on, for example, the position of either the first connection pad 5a or the second connection pads 6a having a smaller area as viewed in a plan view. The side wire 7a in such an application pattern allows the first connection pad 5a and the second connection pad 6a to be appropriately connected to each other. In other words, the display device 1 allows greater positional deviations between the first connection pad 5a and the second connection pad 6a than when the first connection pad 5a and the second connection pad 6a have the same shape (specifically, the same area) as viewed in a plan view. The display device 1 may also allow a positional deviation of the side wire 7a. The display device 1 thus improves the manufacturing yield. The display device 1 also allows multiple first connection pads 5 and multiple second connection pads 6 to be appropriately connected to each other, supplying a uniform and stable power supply voltage to the pixel units 3. More specifically, the pixel units 3 receiving input of the same power supply voltage are less likely to receive power supply voltages with different voltage levels. This can reduce uneven luminance or uneven colors in the display device 1 and improve the image quality of the display device 1.

The second connection pad 6a may be, as illustrated in FIG. 3A, larger than the first connection pad 5a connected to the second connection pad 6a as viewed in a plan view. For example, the second connection pad 6a may have a larger area than the first connection pad 5a. In this case, the area of the first connection pad 5a as viewed in a plan view can be small, reducing the frame portion of the display device 1 and allowing the display device 1 to have a smaller frame portion or no frame portion. This structure also facilitates arrangement of multiple first connection pads 5a at positions corresponding to a small pixel pitch in the display device 1 that displays high-definition images. With this structure, the display device 1, which allows positional deviation of the first connection pad 5a and the second connection pad 6a, can include a smaller frame portion or no frame portion, and have a small pixel pitch. The structure can thus improve the manufacturing yield and the image quality of the display device 1. The structure also allows a multi-display including multiple display devices 1 to have a uniform pixel pitch and an improved image quality.

The second connection pad 6a may be longer than the first connection pad 5a in the direction along the edge 2d. This allows positional deviations of the first connection pad 5a and the second connection pad 6a in the direction along the edge 2d. More specifically, for any positional deviation, the second connection pad 6a can remain including the first connection pad 5a or overlapping most of the first connection pad 5a in the direction along the edge 2d. This reduces the likelihood of deteriorating connection between the first connection pad 5a and the second connection pad 6a with the side wire 7a. The second connection pad 6a may have, in the direction along the edge 2d, a length of, but not limited to, more than one time and not more than about twice the length of the first connection pad 5a in the direction along the edge 2d.

The second connection pad 6a may have a width (e.g., referred to as a width w1) in a portion adjacent to and along the edge 2d greater than the width (e.g., referred to as a width w2) in a portion along the edge 2d opposite to the portion adjacent to the edge 2d. For example, as illustrated in FIG. 3B, the second connection pad 6a may have an extension 6ae extending in the direction along the edge 2d in its portion adjacent to the edge 2d. This structure allows greater positional deviations between the first connection pad 5a and the second connection pad 6a in the direction along the edge 2d. This also further reduces the likelihood of deteriorating connection between the first connection pad 5a and the second connection pad 6a with the side wire 7a. The extension 6ae serves as a guide to draw the conductive paste in the depth direction (opposite to the edge 2d) when the conductive paste is applied to form the side wire 7a. This further improves the connection of the side wire 7a with the second connection pad 6a. The second connection pad 6a may have extensions 6ae extending in the direction along the edge 2d at the two ends adjacent to the edge 2d. This structure allows the above effects to be produced more effectively. To produce the same effects, the second connection pad 6a may be trapezoidal with its side adjacent to the edge 2d being the lower base and with its side opposite to the edge 2d being the upper base. The width w1 may be, but not limited to, more than one time but not more than about 1.5 times the width w2. The first connection pad 5a may also have a width in a portion adjacent to and along the edge 2d greater than the width in a portion along the edge 2d opposite to the portion adjacent to the edge 2d.

Figure 3C:
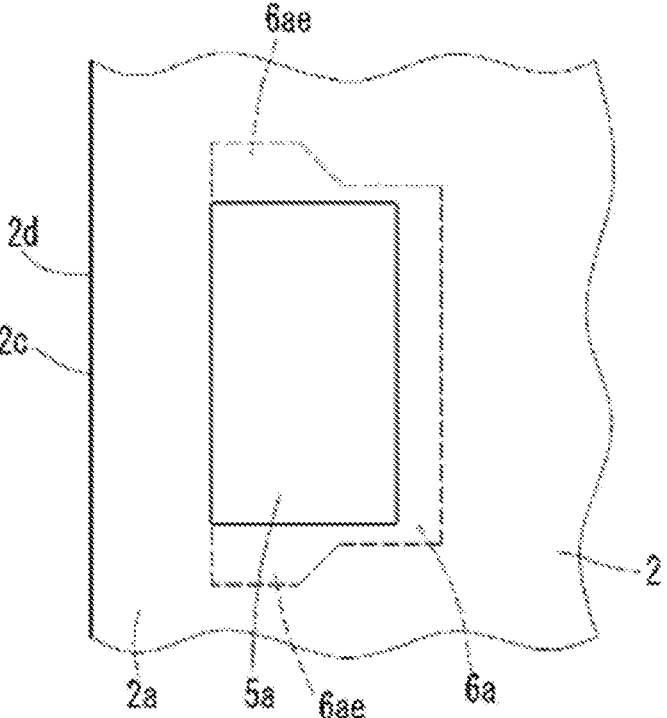
FIG. 3C is a partial plan view of a display device according to a variation of the embodiment of the present disclosure, illustrating its main part in an enlarged manner.

The second connection pad 6a, as illustrated in FIG. 3C, may have an extension 6ae extending in the direction along the edge 2d in a portion adjacent to the edge 2d. The extension 6ae may have a width gradually decreasing from the end adjacent to the edge 2d in the depth direction. In this case, the extension 6ae serves more effectively as a guide to draw the conductive paste in the depth direction. The first connection pad 5a may have the same or similar structure.

As illustrated in, for example, FIG. 3A, the first connection pad 5a may be located between the two ends of the second connection pad 6a in the direction along the edge 2d as viewed in a plan view. More specifically, the second connection pad 6a may include the first connection pad 5a in the direction along the edge 2d. In this case, the first connection pad 5a and the second connection pad 6a can be connected to each other appropriately by setting a pattern for applying the conductive paste for the side wire 7a based on the position of the first connection pad 5a. This can improve the manufacturing yield and the image quality of the display device 1, and thus the image quality of a multi-display.

The second connection pad 6a, as illustrated in FIG. 3A, may be longer than the first connection pad 5a in the direction intersecting with the direction along the edge 2d. For example, as viewed in a plan view, the second connection pad 6a may be longer than the first connection pad 5a in the direction orthogonal to the edge 2d. This can increase the contact area between the second connection pad 6a and the side wire 7a and can thus reduce the contact resistance between the second connection pad 6a and the side wire 7a. This allows stable supply of a power supply voltage to the pixel units 3, thus further improving the image quality of the display device 1. The above intersecting direction may not be orthogonal to the edge 2d, but may be inclined to the direction along the edge 2d at an angle. The angle may be about 30 to 80° or 60 to 80°.

The second connection pad 6a may include the first connection pad 5a as viewed in a plan view. More specifically, the second connection pad 6a may include the full portion of the first connection pad 5a as viewed in a plan view. This structure allows positional deviations of the first connection pad 5a and the second connection pad 6a in any direction. More specifically, for any positional deviation, the second connection pad 6a can remain including the first connection pad 5a or overlapping most of the first connection pad 5a in any direction. When the side wire 7a deviates from its intended position due to lower printing accuracy or other causes, the above effects also allow the first connection pad 5a and the second connection pad 6a to be appropriately connected to each other with the side wire 7a.

Either the first connection pad 5a or the second connection pad 6a having a larger size may be circular or oval. This structure allows greater positional deviations between the first connection pad 5a and the second connection pad 6a in any direction. The second connection pad 6a in this structure may include the first connection pad 5a as viewed in a plan view. This structure allows still greater positional deviations between the first connection pad 5a and the second connection pad 6a in any direction.

The second connection pad 6a may have a shape similar to the shape of the first connection pad 5a. This structure allows greater positional deviations between the first connection pad 5a and the second connection pad 6a in any direction. The second connection pad 6a in this structure may include the first connection pad 5a as viewed in a plan view. This structure allows still greater positional deviations between the first connection pad 5a and the second connection pad 6a in any direction.

The second connection pad 6a may have its center aligned with the center of the first connection pad 5a. This structure allows greater positional deviations between the first connection pad 5a and the second connection pad 6a in any direction. The second connection pad 6a may have its center not completely aligned with the center of the first connection pad 5a. The center of the smaller one of the first connection pad 5a or the second connection pad 6a may be located within an area with the area percentage being about 5 to 30% of the area including the center of the larger one of the first connection pad 5a or the second connection pad 6a. The area percentage may be other than about 5 to 30%.

The first connection pad 5a may be thicker than the second connection pad 6a. This structure allows the first connection pad 5a being smaller than the second connection pad 6a to have lower resistance than the second connection pad 6a. This structure also allows the first connection pad 5a and the second connection pad 6a to have substantially the same resistance. The thickness ratio between the first connection pad 5a and the second connection pad 6a may be the inverse of the area ratio between the first connection pad 5a and the second connection pad 6a.

The first connection pad 5a may have a higher conductivity than the second connection pad 6a. This structure allows the first connection pad 5a being smaller than the second connection pad 6a to have lower resistance than the second connection pad 6a. This structure also allows the first connection pad 5a and the second connection pad 6a to have substantially the same resistance. The conductivity ratio between the first connection pad 5a and the second connection pad 6a having the same thickness may be the inverse of the area ratio between the first connection pad 5a and the second connection pad 6a.

The first connection pad 5a and the second connection pad 6a may have their conductivity adjusted using different materials for the respective connection pads. For example, with the conductivity of soft copper being 100 under the International Annealed Copper Standard (IACS) measurement (% IACS), the conductivity is 105.7 for silver, 100 for soft copper, 59.5 for aluminum, 31.4 for molybdenum, 24.2 for nickel, 20.0 for indium, 14.6 for tin, 13.4 for chromium, 11.0 for niobium, and 4.0 for titanium. The combination of the materials for the first connection pad 5a and the second connection pad 6a may be selected from these metals to allow the first connection pad 5a to have a higher conductivity than the second connection pad 6a. When the first connection pad 5a and the second connection pad 6a are made of conductive pastes, the conductive paste for the first connection pad 5a may contain a greater amount of conductive particles (e.g., silver particles) than the conductive paste for the second connection pad 6a.

As illustrated in, for example, FIG. 7, a distance L6 between the second connection pad 6a and the edge 2d may be larger than a distance L5 between the first connection pad 5a and the edge 2d as viewed in a plan view. The manufacturing processes of the display device 1 may include cutting, by laser processing, a mother substrate on which the first connection pads 5, the second connection pads 6, and other components are formed. When the distance L6 is larger than the distance L5, the mother substrate may be cut with a laser beam irradiating the second surface 2b. This reduces thermal damage to, for example, the first connection pad 5a and the second connection pad 6a in cutting the mother substrate. The side wire 7a can thus appropriately connect to the first connection pad 5a and the second connection pad 6a and have a lower contact resistance with each of the first connection pad 5a and the second connection pad 6a. This allows stable supply of a power supply voltage to the pixel units 3, thus further improving the image quality of the display device 1.

The side wire 7a connecting the first connection pad 5a and the second connection pad 6a may have the same width across its length as illustrated in FIGS. 6A and 8A, or have a greater width in a portion connected to the second connection pad 6a than in a portion connected to the first connection pad 5a as illustrated in FIGS. 6B and 8B. More specifically, the portion of the side wire 7a located on the second connection pad 6a may have a greater width than the portion of the side wire 7a located on the first surface 2a as viewed in a plan view. This structure can accommodate any positional deviation of the second connection pad 6a relative to the first connection pad 5a, or for example, relative to the position of a second connection pad 6a1, to allow the first connection pad 5a and the second connection pad 6a1 to be connected appropriately. This structure can also reduce the contact resistance between the second connection pad 6a1 and the side wire 7a. This structure can also reduce the resistance across the side wire 7a. This allows stable supply of a power supply voltage to the pixel units 3, thus further improving the image quality of the display device 1. For any positional deviation in the pattern for applying the conductive paste for the side wire 7a, this structure can connect the second connection pad 6a and the side wire 7a and thus effectively reduce the likelihood of a lower manufacturing yield.

As illustrated in, for example, FIG. 9, the side wire 7a may include, in a portion corresponding to the side surface 2c of the substrate 2, a thicker portion thicker than the other portion. More specifically, the side wire 7a may include, on the side surface 2c, a portion (thicker portion) that is thicker than the portion on the first connection pad 5a and the portion on the second connection pad 6a. This structure can reduce the electrical resistance of the side wire 7a, allowing stable supply of a power supply voltage to the pixel units 3. This further improves the image quality of the display device 1. The thicker portion of the side wire 7a may be formed by, for example, plating the side surface 2c with a metal underlayer and applying the conductive paste to cover the metal underlayer. The thicker portion may have a thickness of, but not limited to, more than one time and not more than about five times the thickness of the other portions and a length of about 10 to 100% of the length of the side surface 2c (corresponding to the thickness of the substrate 2).

A display device according to another embodiment of the present disclosure will now be described. FIGS. 10 to 14 are each a development view of a display device according to another embodiment of the present disclosure, illustrating a side wire. The development views in FIGS. 10 to 14 correspond to the development views in FIGS. 8A and 8B.

As illustrated in, for example, FIGS. 10 to 14, the side wire 7a from the portion connected to the first connection pad 5a toward the portion connected to the second connection pad 6a may increase in width. In some embodiments, the side wire 7a from the portion connected to the second connection pad 6a toward the portion connected to the first connection pad 5a may increase in width. More specifically, the side wire 7a may have different widths on its portion closer to the first surface 2a and on its portion closer to the second surface 2b as viewed from the front (specifically, in a direction orthogonal to the side surface 2c).

The second connection pad 6a may have a larger area than the first connection pad 5a as viewed in a plan view. This structure can reduce the likelihood of deteriorating connection between the second connection pad 6a and the third wiring pattern 10 as back wiring formed by printing, or in other words, an increase in contact resistance, despite any positional deviation in the third wiring pattern 10 due to lower printing accuracy. In this structure, as illustrated in, for example, FIGS. 10 to 14, the portion of the side wire 7a closer to the second surface 2b may have a greater width than the portion closer to the first surface 2a. This structure can reduce the electrical resistance of the side wire 7a and thus allows stable supply of a power supply voltage to the pixel units 3, thus further improving the image quality of the display device 1. For any positional deviations of the first connection pad 5a and the second connection pad 6a or any positional deviation in the pattern for applying the conductive paste for the side wire 7a, this structure can connect the side wire 7a to the first connection pad 5a and to the second connection pad 6a without any deteriorating connection and thus effectively reduce the likelihood of a lower manufacturing yield.

Figure 10:
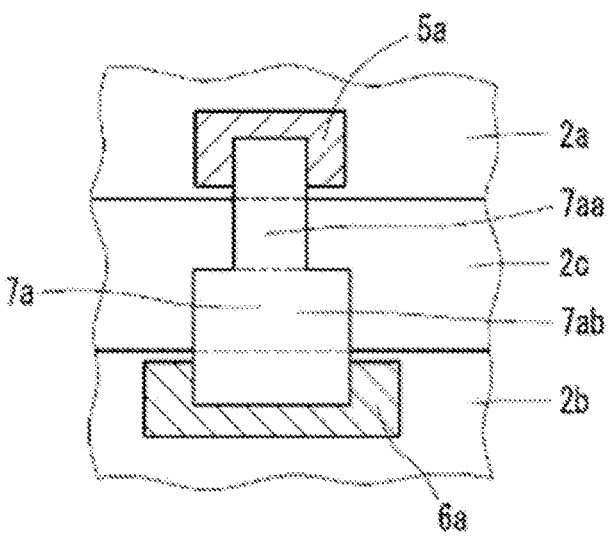
FIG. 10 is a development view of a display device according to another embodiment of the present disclosure, illustrating a side wire.
Figure 11:
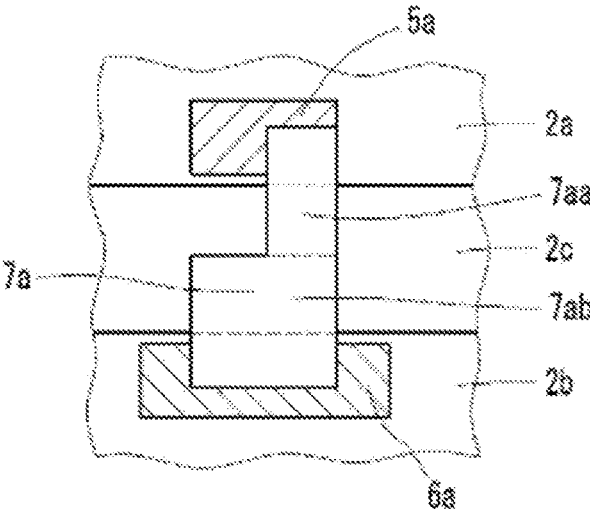
FIG. 11 is a development view of a display device according to another embodiment of the present disclosure, illustrating a side wire.

As illustrated in, for example, FIGS. 10 and 11, the side wire 7a may include multiple substantially rectangular portions 7aa and 7ab on the side surface 2c. More specifically, the side wire 7a may increase in width in a stepwise manner. As illustrated in, for example, FIG. 10, the substantially rectangular portions 7aa and 7ab may be located to have the direction of an imaginary line connecting the centers of the portion 7aa and the portion 7ab substantially parallel to the extending direction of the side wire 7a (the vertical direction in FIG. 10) in a front view of the side surface 2c. The center of the portion 7aa may be the intersection of diagonals. The same applies to the portion 7ab. As illustrated in, for example, FIG. 11, the substantially rectangular portions 7aa and 7ab may be located to have a side of the portion 7aa and a side of the portion 7ab on the same straight line as viewed laterally. In the example structures illustrated in FIGS. 10 and 11, the side wire 7a includes two substantially rectangular portions. However, the side wire 7a may have three or more substantially rectangular portions.

Figure 12:
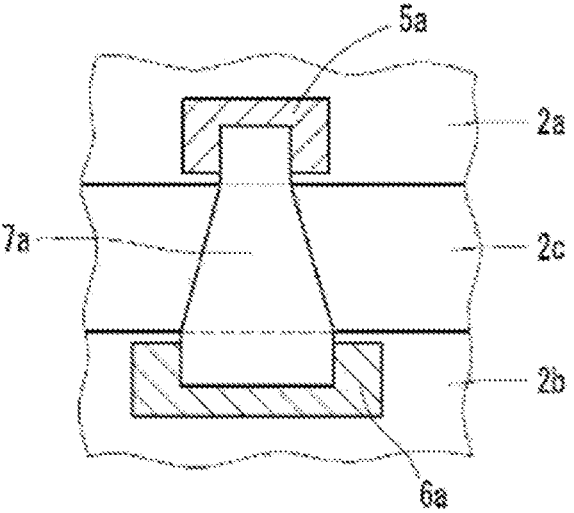
FIG. 12 is a development view of a display device according to another embodiment of the present disclosure, illustrating a side wire.

As illustrated in, for example, FIG. 12, the side wire 7a may be trapezoidal with the upper base located on the first surface 2a and the lower base located on the second surface 2b as viewed from the front. More specifically, the side wire 7a may have a gradually increasing width. In the example structure illustrated in FIG. 12, the side wire 7a is isosceles trapezoidal as viewed from the front. However, the side wire 7a as viewed from the front may have another trapezoidal shape.

Figure 13:
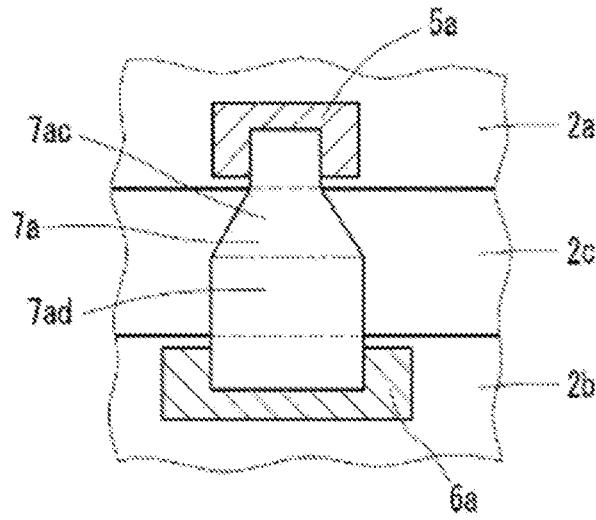
FIG. 13 is a development view of a display device according to another embodiment of the present disclosure, illustrating a side wire.
Figure 14:
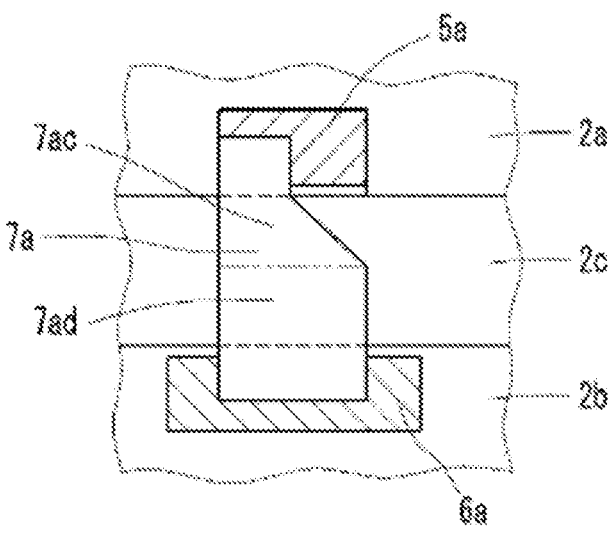
FIG. 14 is a development view of a display device according to another embodiment of the present disclosure, illustrating a side wire.

As illustrated in, for example, FIGS. 13 and 14, the side wire 7a may include a substantially trapezoidal portion 7ac and a substantially rectangular portion 7ad on the side surface 2c. More specifically, the side wire 7a may have a gradually increasing width partway and then have a constant width. As illustrated in, for example, FIG. 13, the substantially trapezoidal portion 7ac and the substantially rectangular portion 7ad may be located to have the direction of an imaginary line connecting the centers of the substantially trapezoidal portion 7ac and the substantially rectangular portion 7ad substantially parallel to the extending direction of the side wire 7a (the vertical direction in FIG. 13) as viewed from the front. As illustrated in, for example, FIG. 14, the substantially trapezoidal portion 7ac and the substantially rectangular portion 7ad may be located to have one leg of the substantially trapezoidal portion 7ac substantially parallel to the extending direction of the side wire 7a and being on the same straight line with a side of the substantially rectangular portion 7*ad* as viewed from front. The example structures illustrated in FIGS. 13 and 14 have the substantially trapezoidal portion 7*ac* on the first surface 2*a* and the substantially rectangular portion 7*ad* on the second surface 2*b*. However, the side wire 7*a* may have the substantially rectangular portion 7*ad* on the first surface 2*a* and the substantially trapezoidal portion 7*ac* on the second surface 2*b*.

The side wire 7*a* may include a corner (first corner) between the first surface 2*a* and the third surface 2*c* that is a wider portion (first wider portion) with a greater width than the portions adjacent to the corner. This structure can reduce disconnection of the side wire 7*a* at the first corner and reduce degradation of conductivity. The width of the first wider portion may be, but not limited to, more than one time but not more than about twice the width of the adjacent portions. The side wire 7*a* may also include a corner (second corner) between the second surface 2*b* and the third surface 2*c* that is a wider portion (second wider portion) with a greater width than the portions adjacent to the corner. This structure can reduce disconnection of the side wire 7*a* at the second corner and reduce degradation of conductivity. The width of the second wider portion may be, but not limited to, more than one time but not more than about twice the width of the adjacent portions.

The second connection pad 6*a* may be larger than the first connection pad 5*a*, and a thickness in the portion of the side wire 7*a* connected to the first connection pad 5*a* may be greater than a thickness in the portion of the side wire 7*a* connected to the second connection pad 6*a*. In this structure, a width in the portion of the side wire 7*a* connected to the second connection pad 6*a* (hereafter referred to as a connected portion p2) is greater than a width in the portion of the side wire 7*a* connected to the first connection pad 5*a* (hereafter referred to as a connected portion p1). The connected portion p2 of the side wire 7*a* thus has low resistance, but the connected portion p1 has higher resistance than the connected portion p2. In this structure, the resistance of the connected portion p1 can be lowered to a level closer or similar to the resistance of the connected portion p2 by increasing the thickness of the connected portion p1 to be greater than the connected portion p2. This further reduces the resistance across the side wire 7*a*. The thickness of the connected portion p1 may be, but not limited to, more than one time but not more than about three times the thickness of the connected portion p2 (about 1 to 20 μm).

The first connection pad 5*a* may be larger than the second connection pad 6*a*. For example, the first connection pad 5*a* may be substantially as wide as the second connection pad 6*a* and longer than the second connection pad 6*a*. In this structure, the first connection pad 5*a* has a shorter connection distance to the closest light emitter 32. This reduces the contact resistance between the first connection pad 5*a* and the light emitter 32 connected to first connection pad 5*a* and facilitates control of luminescence properties of the light emitter 32 including luminance. The length of the first connection pad 5*a* may be, but not limited to, more than one time and not more than about five times the length of the second connection pad 6*a*.

Figure 15:
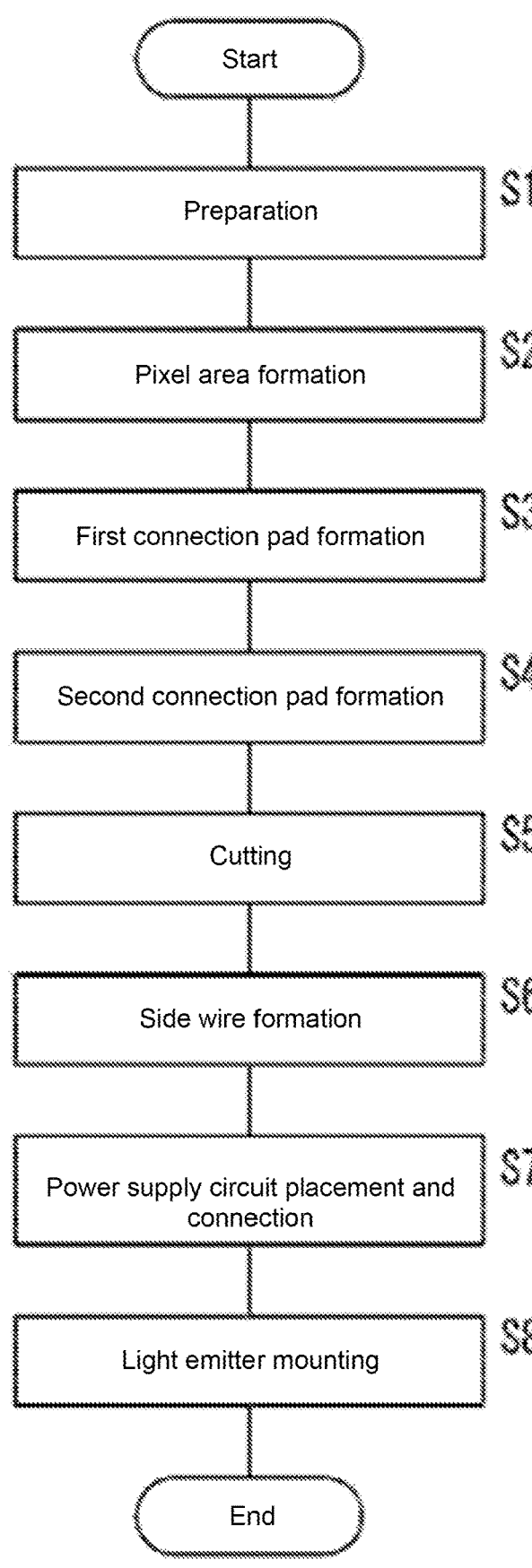
FIG. 15 is a flowchart of a method for manufacturing a display device according to an embodiment of the present disclosure.

A method for manufacturing the display device will now be described. FIG. 15 is a flowchart of a method for manufacturing the display device according to one embodiment of the present disclosure.

In the present embodiment, the method for manufacturing the display device includes preparation S1, pixel area formation S2, first connection pad formation S3, second connection pad formation S4, cutting S5, and side wire formation S6.

The method for manufacturing the display device includes the preparation S1 for preparing a mother substrate including a first surface (corresponding to the first surface 2*a* of the substrate 2), a second surface (corresponding to the second surface 2*b* of the substrate 2) opposite to the first surface, and multiple display device areas on the first surface, the pixel area formation S2 for forming multiple pixel areas in each of the display device areas, the first connection pad formation S3 for forming the first connection pad 5 on a portion adjacent to an edge (corresponding to the edge 2*d* of the substrate 2) of each of the display device areas, the second connection pad formation S4 for forming the second connection pad 6 having a size different from the size of the first connection pad 5 in a portion adjacent to the edge on the second surface, the cutting S5 for cutting the mother substrate along the edge to form display device substrates, and the side wire formation S6 for forming, on each of the display device substrates, the side wire 7 extending from the first surface through a cut surface being a side surface (corresponding to the side surface 2*c* of the substrate 2) to the second surface to connect the first connection pad 5 and the second connection pad 6.

The preparation S1 is the process of preparing a mother substrate for manufacturing the display device 1. The mother substrate includes the first surface and the second surface opposite to the first surface. The mother substrate includes at least one display device area to be the display device 1.

The pixel area formation S2 is the process of forming multiple pixel areas arranged in a matrix at a predetermined pitch in the display device area on the first surface. Each pixel area herein refers to, for example, the pixel unit 3 illustrated in FIG. 4 excluding the light emitter 32. The pixel areas can be formed with a known method, such as a thin film formation method (e.g., plating, vapor deposition, or CVD), photolithography, or etching.

The first connection pad formation S3 is the process of forming multiple first connection pads 5 in the display device area on the first surface adjacent to the edge of the display device area to connect the first connection pads 5 to the electrode pads 31. The first connection pads 5 can be formed with a known method, such as a thin film formation method (e.g., plating, vapor deposition, or CVD), photolithography, or etching.

The second connection pad formation S4 is the process of forming the second connection pads 6 in the display device area on the second surface adjacent to the edge of the display device area to connect the second connection pads 6 to the first connection pads 5. In the second connection pad formation S4, the second connection pads 6 are formed to cause at least one second connection pad 6*a* of the second connection pads 6 to have an area different from the area of the first connection pad 5*a* connected to the at least one second connection pad 6*a* as viewed in a plan view. The second connection pads 6 can be formed with a known method, such as a thin film formation method (e.g., plating, vapor deposition, or CVD), printing, photolithography, or etching.

In the second connection pad formation S4, the second connection pads 6 may be formed to cause the smallest value of the distances between the edge of the display device area and the electrode pads 31 and the smallest value of the distances between the edge of the display device area and the first connection pads 5 to be each shorter than the smallest value of the distances between the edge of the display device area and the second connection pads 6 as viewed in a plan view. A first display device 1 can thus be combined with a second display device 1 to form a multi-display to have a pixel pitch between the first display device 1 and the second display device 1 substantially equal to the pixel pitch P of each display device 1. The multi-display can thus have higher image quality.

The pixel area formation S2, the first connection pad formation S3, and the second connection pad formation S4 may be performed in any order. The pixel area formation S2 and the first connection pad formation S3 may be performed at the same time.

The cutting S5 is the process of cutting the mother substrate along the edge of the display device area into substrate segments (display device substrates) each including the display device area. The cutting S5 can be performed by, for example, mechanical scribing or laser scribing.

The cutting S5 may be performed by laser scribing using a laser beam emitted from, for example, a CO 2 laser or an yttrium aluminum garnet (YAG) laser to irradiate the second surface of the mother substrate along the edge of the display device area to separate the display device area from the mother substrate. The mother substrate may be cut by laser scribing more accurately than by mechanical scribing. The second connection pads 6 are spaced from the edge of the display device area by a relatively long distance, and are thus less susceptible to damage from the laser beam. The manufactured display device 1 thus has high image quality.

In the present embodiment, the method for manufacturing the display device includes, after the cutting S5, the side wire formation S6, power supply circuit placement and connection S7, and light emitter mounting S8.

The side wire formation S6 is the process of forming, on each display device substrate resulting from the cutting S5, the side wires 7 extending from the side surface 2c to the first surface 2a and to the second surface 2b. The side surface 2c connects the first surface 2a and the second surface 2b. The side wires 7 connect the first connection pads 5 and the second connection pads 6.

The side wires 7 may include a conductive paste containing conductive particles of, for example, Ag, Cu, Al, or stainless steel, an uncured resin component, an alcohol solvent, and water. The conductive paste may be applied to intended portions from the side surface 2c to the first surface 2a and to the second surface 2b of the display device substrate and cured by heating, photocuring using ultraviolet ray irradiation, or a combination of photocuring and heating. The side wires 7 may also be formed with a thin film formation method such as plating, vapor deposition, or CVD. The display device substrate may have the side surface 2c with grooves formed in advance to receive the side wires 7. This allows the conductive paste for the side wires 7 to be easily received in the intended portions on the side surface 2c of the display device substrate.

The side wire formation S6 may form wide wires 7 including a stack of multiple layers. This structure can increase the thickness of the side wires 7 to lower the resistance. This structure also facilitates adjustment of the resistance of the side wires 7 to an intended value. For the side wires 7 formed by applying and firing a conductive paste, the process of applying and firing the conductive paste may be performed multiple times. For the side wires 7 formed with a thin-film formation method, the formation process may be performed multiple times as well. In this structure, the side wires 7 may include upper layers thinner than their lower layers. This further facilitates adjustment of the resistance of the side wires 7 to an intended value. For example, for a side wire 7 with two layers, the second layer (upper layer) may be thinner than the first layer (lower layer).

The placement and connection S7 of the power supply circuit 4 is the process of placing the power supply circuit 4 on the second surface 2b and connecting the power supply circuit 4 to the second connection pads 6. In the placement and connection S7 of the power supply circuit 4, the power supply circuit 4 may be prepared in advance and mounted on the second surface 2b of the display device substrate, or may be directly formed on the second surface 2b of the display device substrate with a known method, such as a thin film formation method (e.g., plating, vapor deposition, or CVD), photolithography, or etching.

The light emitter mounting S8 is the process of mounting the light emitters 32 on the pixel areas. The light emitters 32 may be, for example, LEDs. The light emitters 32 may be micro-LEDs. In the light emitter mounting S8, three light emitters 32R, 32G, and 32B may be mounted on the respective pixel areas.

The side wire formation S6, the power supply circuit placement and connection S7, and the light emitter mounting S8 may be performed in any order.

The display device 1 manufactured with the above method can form a multi-display with higher image quality.

In one or more embodiments of the present disclosure, the display device includes the first connection pad and the second connection pad having different sizes. When the first connection pad and the second connection pad deviate from their intended positions due to lower printing accuracy or other causes, either the first connection pad or the second connection pad having a larger size can compensate for (accommodate) the positional deviation. This allows the first connection pad and the second connection pad to be appropriately connected to each other with the side wire. When the side wire deviates from its intended position due to lower printing accuracy or other causes, the above effects also allow the first connection pad and the second connection pad to be appropriately connected to each other with the side wire, thus improving the manufacturing yield of the display device and the image quality. In one or more embodiments of the present disclosure, the method for manufacturing the display device can improve the manufacturing yield and allows manufacture of display devices with improved image quality.

Although the display device and the method for manufacturing the display device according to the embodiments of the present disclosure have been described in detail, the display device and the method for manufacturing the display device according to the embodiments of the present disclosure are not limited to those in the above embodiments, and may be changed or varied in various manners without departing from the spirit and scope of the present disclosure. The components described in the above embodiments may be entirely or partially combined as appropriate unless any contradiction arises.

INDUSTRIAL APPLICABILITY

Although the display devices according to the embodiments of the present disclosure have been described in detail, the display devices according to the embodiments of the present disclosure are not limited to those in the above embodiments, and may be changed or varied in various manners without departing from the spirit and scope of the present disclosure. The components described in the above embodiments may be entirely or partially combined as appropriate unless any contradiction arises. In one or more embodiments of the present disclosure, each display device can be used in various electronic devices. Such electronic devices include, for example, automobile route guidance systems (car navigation systems), ship route guidance systems, aircraft route guidance systems, smartphones, mobile phones, tablets, personal digital assistants (PDAs), video cameras, digital still cameras, electronic organizers, electronic dictionaries, personal computers, copiers, terminals for game devices, television sets, product display tags, price display tags, programmable display devices for industrial use, car audio systems, digital audio players, facsimile machines, printers, automatic teller machines (ATMs), vending machines, digital display watches, smartwatches, and information displays at stations, airports, and other facilities.

REFERENCE SIGNS 1 display device
2 substrate
2a first surface
2b second surface
2c third surface (side surface)
2d edge
3 pixel unit
31 electrode pad
31a anode pad
31b cathode pad
32, 32R, 32G, 32B light emitter
32a anode terminal
32b cathode terminal
33, 34, 35, 36 insulating layer
37 transparent conductive layer
4 power supply circuit
41 VDD terminal
42 VSS terminal
5, 5a first connection pad
51 first power supply connection pad
52 second power supply connection pad
53, 54 metal layer
55, 56, 57 insulating layer
58 transparent conductive layer
6, 6a, 6a1 second connection pad
6ae extension
7, 7a side wire
7aa, lab, lac, lad portion
8 first wiring pattern
9 second wiring pattern
10 third wiring pattern
61 third power supply connection pad
62 fourth power supply connection pad
63 metal layer
64 protective insulating layer
65 transparent conductive layer

The invention claimed is:
1. A display device, comprising:
a substrate including a first surface, a side surface, and a second surface opposite to the first surface;
a pixel unit on the first surface, the pixel unit including a light emitter;
a first connection pad adjacent to an edge on the first surface, the first connection pad being electrically connected to the pixel unit;
a second connection pad adjacent to the edge on the second surface; and

20 a side wire extending from the first surface through the side surface to the second surface, the side wire connecting the first connection pad and the second connection pad,
wherein the second connection pad is larger than the first connection pad and includes an extension extending in a direction along the edge.
2. The display device according to claim 1, wherein the second connection pad is longer than the first connection pad in a direction along the edge.
3. The display device according to claim 2, wherein the first connection pad is between two ends of the second connection pad in the direction along the edge as viewed in a plan view.
4. The display device according to claim 1, wherein the second connection pad is longer than the first connection pad in a direction intersecting with a direction along the edge.
5. The display device according to claim 1, wherein the second connection pad overlaps the first connection pad as viewed in the plan view.
6. The display device according to claim 1, wherein the first connection pad is thicker than the second connection pad.
7. The display device according to claim 1, wherein the first connection pad has a higher conductivity than the second connection pad.
8. The display device according to claim 1, wherein a width in a portion of the side wire connected to the second connection pad is greater than a width in a portion of the side wire connected to the first connection pad.
9. The display device according to claim 8, wherein the side wire from the portion connected to the first connection pad to the portion connected to the second connection pad increases in width.
10. The display device according to claim 1, wherein a thickness in a portion of the side wire connected to the first connection pad is greater than a thickness in a portion of the side wire connected to the second connection pad.
11. The display device according to claim 1, wherein the side wire includes a thicker portion thicker than another portion of the side wire, and the thicker portion is in a portion of the side wire corresponding to the side surface of the substrate.
12. The display device according to claim 1, wherein the light emitter is a micro-light-emitting diode.
13. A method for manufacturing a display device, the method comprising:
preparing a mother substrate including a first surface, a second surface opposite to the first surface, and a plurality of display device areas on the first surface;
forming a plurality of pixel areas on each of the plurality of display device areas;
forming a first connection pad on a portion adjacent to an edge on each of the plurality of display device areas;
forming a second connection pad on a portion adjacent to the edge on the second surface, the second connection pad being larger than the first connection pad and including an extension extending in a direction along the edge;
cutting the mother substrate along the edge of each of the plurality of display device areas to form display device substrates; and
forming, on each of the display device substrates, a side wire extending from the first surface through a cut surface being a side surface of each of the display substrates to the second surface to connect the first connection pad and the second connection pad.

14. The method according to claim 13, wherein cutting the mother substrate includes irradiating the second surface with a laser beam along the edge to cut the mother substrate.

15. The method according to claim 13, wherein forming the side wire includes forming a side wire including a stack of a plurality of layers.

* * * * *